United States Patent [19]

Schrantz

[11] Patent Number: 4,683,485
[45] Date of Patent: Jul. 28, 1987

[54] TECHNIQUE FOR INCREASING GATE-DRAIN BREAKDOWN VOLTAGE OF ION-IMPLANTED JFET

[75] Inventor: Gregory A. Schrantz, Melbourne, Fla.

[73] Assignee: Harris Corporation, Melbourne, Fla.

[21] Appl. No.: 813,718

[22] Filed: Dec. 27, 1985

[51] Int. Cl.⁴ .............................................. H01L 29/80
[52] U.S. Cl. ........................................ 357/22; 357/15; 357/91
[58] Field of Search ............................... 357/22, 15, 91

[56] References Cited

U.S. PATENT DOCUMENTS 3,681,668  8/1972  Kobayashi ..................... 357/22 R
4,143,386  3/1979  Kaiser .......................... 357/22 R Primary Examiner—Edward J. Wojciechowicz
Attorney, Agent, or Firm—Antonelli, Terry & Wands

[57] ABSTRACT

The gate-drain breakdown voltage of an ion-implanted JFET is effectively increased by forming the top gate region through two sequential implantation steps to result in respective pockets of different impurity concentration. The deeper pocket (defining the top gate-drain PN junction) has a low impurity concentration profile thereby increasing the breakdown voltage of the gate-drain PN junction, while a second higher impurity concentration implant, which forms a pocket in the first implanted pocket of the top gate, provides the necessary charge carrier concentration to prevent the top gate from becoming fully depleted when the device is biased near pinch-off.

6 Claims, 4 Drawing Figures

TECHNIQUE FOR INCREASING GATE-DRAIN BREAKDOWN VOLTAGE OF ION-IMPLANTED JFET

FIELD OF THE INVENTION

The present invention relates in general to semiconductor devices and is particularly directed to a junction field effect transistor (JFET) having an ion-implanted channel, ion-implanted top gate structure.

BACKGROUND OF THE INVENTION

Ion-implanted junction field effect transistors (hearinafter termed I²JFETs) typically contain a buried (ion-implanted) channel region which bridges or joins respective source and drain regions of the JFET and the conductive properties of which are controlled by modulation of the space-charge region width formed with the adjoining top gate and bottom gate regions. The device structure of an exemplary P-channel I²JFET is diagrammatically shown in cross-section in FIG. 1 as comprising a substrate (e.g. silicon, gallium arsenide) 10 of N-type conductivity, forming the bottom gate of the device, into a top surface 11 of which respective P-type drain and source regions 15 and 16 are respectively formed. Respective drain and source contact regions 17 and 18 of high impurity concentration P+material are introduced into the surface 11 to a prescribed depth in the respective source and drain regions 15 and 16. Overlying the top surface 11 of the substrate 10 is a field oxide layer 25, a relatively thin portion 14 of which lies atop that portion of the substrate into which a top gate region and channel are to be formed. This is shown diagrammatically in FIG. 1 as being disposed between the respective drain and source regions 15 and 16. Apertures in the field oxide 25 are provided for contacting respective drain and source metallizations 23 and 24 to high impurity concentration P+regions 17 and 18.

The gate/channel structure of the JFET is provided by way of an implanted top gate region 22 of N-type conductivity. Gate region 22 may be formed by implanting suitable N-type conductivity ions, region 22 forming a PN junction 31 with the implanted P material of a channel region 21 provided therebeneath and bridging drain region 15 with source region 16. Channel region 21 forms a PN junction 32 with the N material of the substrate therebeneath. That portion of top gate region 22 which defines a gate-drain PN junction with the P material of drain region 15 is referenced as PN junction 41, an extension of PN junction 31. Also, that portion of top gate region 22 which defines a gate-source PN junction with the P material of source region 16 is referenced as PN junction 42, an extension of PN junction 31.

In operation, the channel region 21 is normally conductive, so as to provide a current path between the drain and source regions 15 and 16. In response to the application of a reverse-biasing gate voltage to the top gate 22 and bottom gate (substrate 10), majority charge carriers are depleted from the channel 21. As the space-charge regions extend into the channel, the channel resistance increases, thereby reducing the current between the drain and the source. The top gate is typically tied to the bottom gate with a suitable high impurity concentration (N+) diffused region (not shown).

In the course of manufacture of the device shown in FIG. 1, the high impurity concentration of the top gate region that is necessary to provide charge carrier supply and thereby prevent the top gate from fully depleting at pinch-off limits the breakdown voltage of the gate-drain PN junction 41 to a value on the order of 10 to 40 volts. In order to increase the breakdown voltage, the concentration gradient of the top gate-drain junction 41 must be decreased. One way of accomplishing this decrease would be to increase the sheet resistance of drain region 15. Unfortunately, this would introduce a separate set of problems.

More particularly, it is typically the case that the P-channel JFET shown in FIG. 1 is integrated with other circuit components, including bipolar devices. As such, the diffusion which forms drain region 15 also forms the P-base of the NPN transistors in the circuit, and must have its sheet resistance optimized for performance of the NPN bipolar transistor. To add a separate diffusion for the drain and source of the JFET in order to modify the concentration gradient of the top gate-drain junction 41 would add an undesirable amount of complexity to the device fabrication process.

SUMMARY OF THE INVENTION

In accordance with the present invention, the concentration gradient of the top gate-drain junction 41 (and top gate-source junction 42) can be decreased by forming the top gate region 22 through two sequential implantation steps resulting in respective pockets of differential impurity concentration, the deeper one of which (defining the top gate-drain and top gate-source PN junctions) has a low impurity concentration thereby increasing the breakdown voltage of the PN junction, while a second implant having a higher impurity concentration, forms a pocket in the first implant of the top gate, providing the necessary charge carrier concentration to prevent the top gate from becoming fully depleted when the device is biased near pinch-off.

DETAILED DESCRIPTION

As pointed out briefly above, the present invention provides a top gate JFET structure wherein the impurity concentration gradient of the top gate-drain PN junction is reduced, yet the top gate region itself contains a sufficiently high concentration of charge carriers to prevent the top gate from fully depleting when the device is biased near pinch-off. This is accomplished in accordance with the present invention by providing the top gate structure in the form of a pair of sequentially implanted regions, the first of which is a low impurity concentration region extending to a prescribed depth from the top surface of the device into the substrate and into the source and drain regions, followed by a second, high impurity concentration region implanted to a lesser depth from the top surface of the device within the first implanted gate region.

Figure 1:
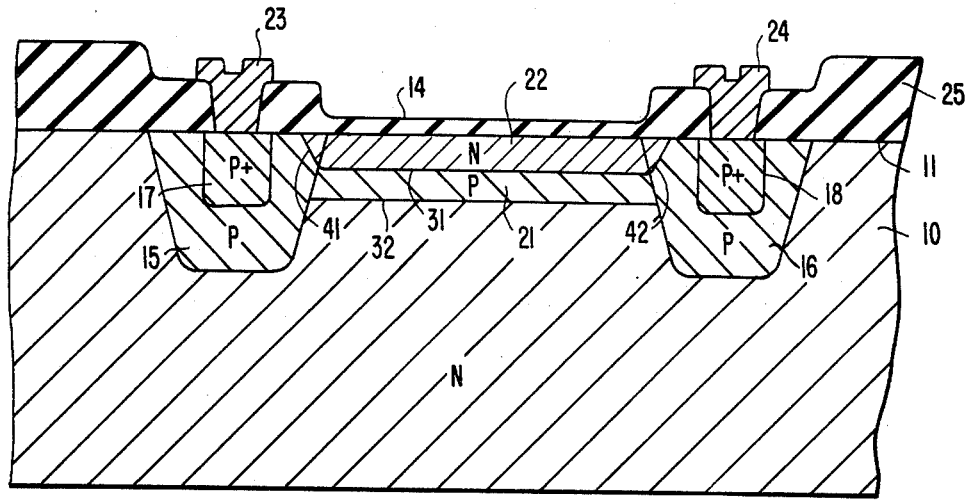
FIG. 1 is a diagrammatic cross-sectional illustration of a conventional ion-implanted P-channel junction field effect transistor with a single implant top gate.
Figure 2:
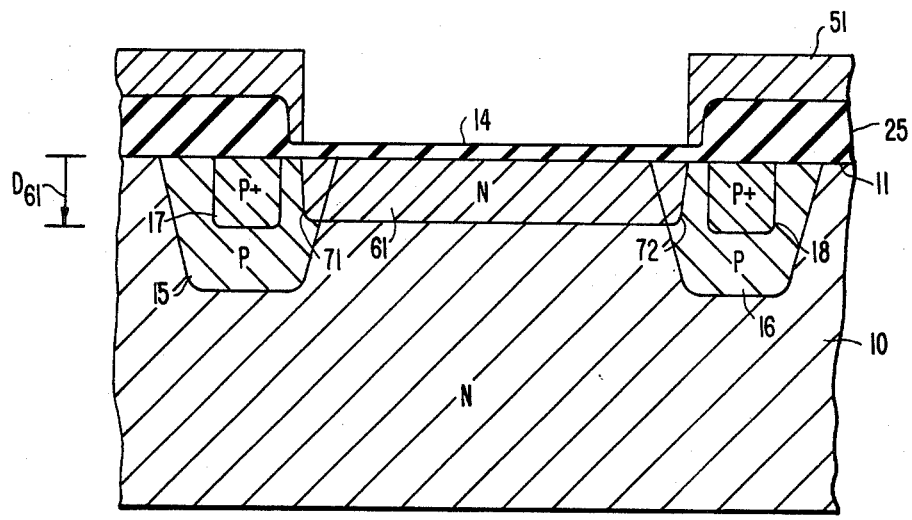
FIGS. 2 and 3 illustrate the manner in which a dual implant top gate structure for an ion implanted P-channel JFET is formed in accordance with the present invention.
Figure 3:
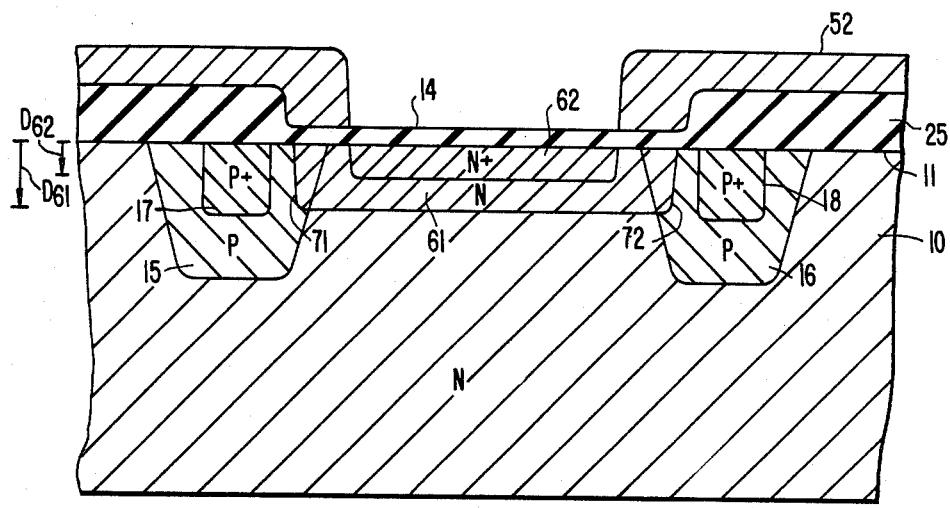

The formation of the first region is illustrated diagrammatically in FIG. 2, which shows a portion of the device described above with reference to FIG. 1, specifically the drain and source regions 15 and 16 extending from the surface 11 of the substrate 10 and over which lies protective field oxide 25. The substrate 10, forming the bottom gate of the JFET, may be a dielectrically isolated region or a junction isolated region. The impurity concentration of the substrate 10 may be in the range of $1 \times 10^{14}$ to $1 \times 10^{17}/cm^3$. As a description of the characteristics of the channel are unnecessary for an understanding of the dual region configuration of the top gate structure of the present invention, they have not been illustrated in FIGS. 2 and 3.

In accordance with the present invention, the top gate is formed by initially implanting a low impurity concentration region into the top surface 11 of the body 10 using a masking photoresist layer 51 in which a suitable window has been formed, masking layer 51 overlying field oxide region 25, as shown. For an exemplary P-channel device formed in an N-substrate, discussed above with reference to FIG. 1, a first region may be formed by an N-type implant (e.g. phosphorus) to obtain a low impurity concentration (e.g. in a range of from to $5 \times 10^{15}$ to $5 \times 10^{17}/cm^3$), region 61. The depth of $D_{61}$ of this first top gate region 61 implanted through thin (0.05 to 0.15 micron) oxide portion 14 of field oxide 25 may be on the order of 0.05 to 0.4 micron. As shown in FIG. 2, the PN junction 71 formed between top gate region 61 and the drain region 15 is defined by the extent of the window in the photo resist mask 51 and the depth D61 of the implanted region 61. For a surface impurity concentration range of from $5 \times 10^{17}$ to $5 \times 10^{19}/cm^3$ within respective drain and source regions 15 and 16, the resulting breakdown voltage of the top gate-drain junction (and top gate-source junction) can be substantially increased from the 10 to 40 volt limit of the device shown in FIG. 1 to a considerably greater value, for example in a range of 40–70 volts.

Because of its low (and uniform since region 61 is non-implanted) impurity concentration profile, the carrier concentration of region 61 is insufficient to effectively enable the channel directly beneath region 61 to fully pinch-off, as the relatively low impurity concentration of region 61 would result in the region 61 becoming fully depleted of charge carriers at pinch-off. To prevent this from happening, a second, high impurity concentration region is implanted in region 61, through the use of a further masking layer 52, shown in FIG. 3, having a smaller aperture or implant window than the masking layer 51 provided for the low impurity concentration region 61. After formation of the second masking layer 52, a second implant of N-type impurities (e.g. phosphorus) is carried out, resulting in the formation of a relatively shallow high impurity concentration (e.g. in a range of from $1 \times 10^{16}$ to $5 \times 10^{18}/cm^3$) region 62 which extends to a depth $D_{62}$ from the surface 11 of the substrate 10 into the first region 61. The depth $D_{62}$ of the second region 62 may be on the order of 0.03 to 0.35 microns. Because the impurity concentration of region 62 is substantially higher than that of region 61, region 62 effectively makes up for the lack of charge carriers available from region 61 when the device is biased near pinch-off, thereby preventing the top gate structure from being fully depleted of charged carriers.

Figure 4:
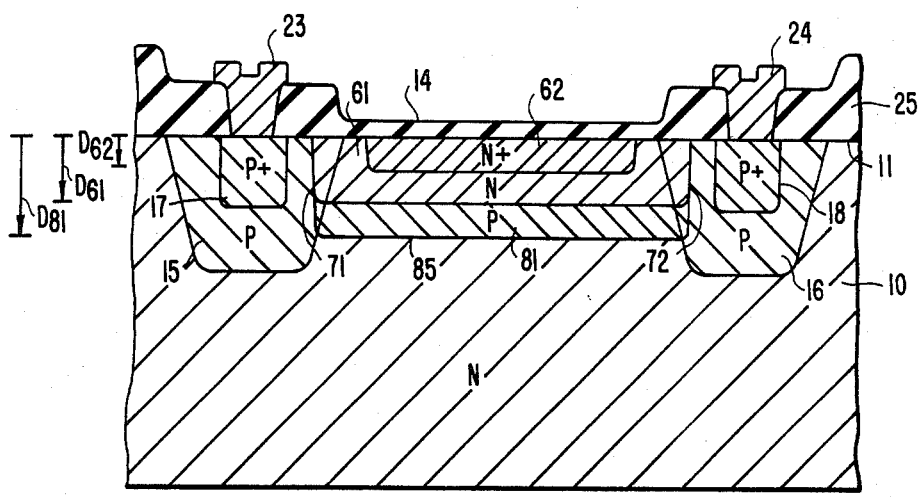
FIG. 4 shows the application of the dual ion implant top gate structure of FIGS. 2 and 3 to an ion implanted P-channel JFET

Referring now to FIG. 4, a more complete illustration of an implanted JFET incorporating the dual-region top gate structure of the present invention is diagrammatically shown as comprising a channel region 81 implanted to a depth $D_{81}$ followed by the dual top gate implantation process described above with reference to FIGS. 2 and 3. Channel 81 forms a PN junction 85 with the substrate 10 itself. In the course of manufacture of the configuration shown in FIG. 4, the same masking photoresist layer 51 (FIG. 2) may be used for both the channel implanted region 81 and the low impurity concentration top gate region 61. Again, as was the case of the description of FIGS. 2 and 3, for a P-channel device, substrate 10 may comprise an N-type conductivity substrate into which P-type conductivity ions are implanted through an aperture in mask 51 to a depth $D_{81}$ of 0.15 to 0.9 micron forming a P-type channel 81 having an impurity concentration on the order of from $5 \times 10^{15}$ to $1 \times 10^{18}/cm^3$. This implantation is then followed by the dual implant of the low concentration region 61 and the high concentration region 62 described above with reference to FIGS. 2 and 3.

Because region 61 is formed by ion implantation, its impurity distribution profile across the separation distance along surface 11 between PN junction 71 and high impurity concentration region 62 is effectively uniform or constant. Its relatively low and uniform value (compared with that of region 62) results in the breakdown voltage of PN junction 71 between the top gate region and the drain region 15 being enhanced as described above, e.g. in a range of 40 to 70 volts While the foregoing description of the present invention makes reference to an exemplary P-channel ion-implanted JFET, it is to be understood that the invention is also applicable to N-channel devices. In this circumstance, the impurities for the respective regions are of opposite conductivity types.

While I have shown and described an embodiment in accordance with the present invention, it is understood that the same is not limited thereto but is susceptible of numerous changes and modifications as known to a person skilled in the art, and I therefore do not wish to be limited to the details shown and described herein but intend to cover all such changes and modifications as are obvious to one of ordinary skill in the art.

What is claimed:

1. A semiconductor device comprising:
   a semiconductor substrate of a first conductivity type;
   a first semiconductor region of a second conductibity type, opposite said first conductivity type, formed in a first surface portion of said substrate;
   a second semiconductor region of said second conductivity type, formed in a second surface portion of said substrate, spaced apart from said first surface portion by a third surface portion therebetween; and
   a third semiconductior region of said first conductivity type formed in said third surface portion of said substrate and being contiguous with said first and second regions so as to define therewith respective first and second PN junctions, and wherein a first portion of said third semiconductor region is spaced apart from said first and second PN junctions by a second portion of said third semiconductior region contiguous with and extending a separation distance away from said first and second PN junctions to said first portion of said third semiconductor region, said first portion of said third semiconductor region having a first impurity concentration, and wherein said said second portion of said third semiconductor region has a second impurity concentration less than said first impurity concentration and the profile of which second impurity concentration of said second portion of said third surface portion of said substrate in which said third semiconductor region is formed is effectively constant across said separation distance between said first and second PN junctions and said first portion of said third semiconductor region; and a fourth semiconductor region of said second conductivity type disposed in said substrate beneath the third surface portion thereof so as to be contiguous with each of said first, second ahd third semiconductor regions and defining a third PN junction with third semiconductor region.

2. A semiconductor device according to claim: 1, wherein said first and second portions of said third semiconductor region are ion-implanted regions.

3. A junction field-effect transistor comprising:
a semiconductor substrate of a first conductivity type having a first surface;
a source region of a second conductivity type, opposite said first conductivity type, disposed in a first surface portion of said substrate;
a drain region of a said second conductivity type disposed in a second surface portion of said substrate spaced apart from said first surface portion of said substrate by a third surface portion therebetween;
a channel region of said second conductivity type, disposed in said substrate beneath said third surface portion thereof and being contiguous with said source and drain regions; and
a top gate region of said first conductivity type disposed in said third surface portion of said substrate and extending to said channel region to define therewith a first PN junction extending from said source region to said drain region, and wherein said top gate region has a first portion overlapping said source and drain regions to define therewith respective second and third PN junctions, said first portion extending a separation distance away from said second and third PN junctions to a second portion of said top gate region spaced apart from said second and third PN junctions by said first portion therebetween, said second portion of said top gate having a first impurity coneentration, and wherein said first portion of said top gate region has a second impurity concentration less than said first impurity concentration and the profile of which second impurity concentration of said first portion of said third surface portion of said substrate in which said top gate region is formed is effectively constant across said separation distance between said first and second PN junctions and said second portion of said top gate region.

4. A junction filed effect transistor according to claim 3, wherein said first and second portions of said top gate region are ion-implanted regions.

5. For use with a junction field effect transistor having a semiconductor substrate of a first conductivity type, a source region of a second condutivity type, opposite said first conductivity type, disposed in a first surface portion of said substrate, a drain region of said second conductivity type disposed in a first surface portion of said substrate apart from said first portion of said substrate by a third surface portion thereof therebetween, a channel region of said second conductivity type disposed in said substrate beneath said third surface portion thereof and being contiguous with said source and drain regions, and a top gate region of said first conductivity type disposed in said third surface portion of said substrate and extending to said channel region and overlapping said source and drain regions so as to define therewith a first PN junction extending from said source region to said drain region, a method of increasing the breakdown voltage of that portion of said first PN junction defined between said top gate region and said drain region, while preventing said top gate region from becoming fully depleted of charge carriers when said transistor is biased to pinch-off said channel region, comprising the step of:

forming said top gate region so as to have a first portion overlapping said source and drain regions to define therewith respective second and third PN junctions, said first portion extending a separation distance away from said second and third PN junctions to a second portion of said top gate region spaced apart from said second and third PN junctions by said first portion therebetween, said second portion of said top gate having a first impurity concentration, and wherein said first portion of said top gate region has a second impurity concentration less than said first impurity concentration and the profile of which second impurity concentration of said first portion of said third surface portion of said substrate in which said top gate region is formed is effectively constant across said separation distance between said first and second PN junctions and said second portion of said top gate region.

6. A method according to claim 5, wherein said first andsecond portions of said top gate region are formed by ion-implantation.

* * * * *